United States Patent [19]
Kwon

[11] Patent Number: 5,696,463
[45] Date of Patent: Dec. 9, 1997

[54] ADDRESS TRANSITION DETECTING CIRCUIT WHICH GENERATES CONSTANT PULSE WIDTH SIGNAL

[75] Inventor: Geoun Tae Kwon, Kyoungki-do, Rep. of Korea

[73] Assignee: Hyundai Electronics Industries Co., Ltd., Kyoungki-do, Rep. of Korea

[21] Appl. No.: 789,512

[22] Filed: Jan. 27, 1997

Related U.S. Application Data

[63] Continuation of Ser. No. 333,479, Nov. 2, 1994, abandoned.

[30] Foreign Application Priority Data

Nov. 2, 1993 [KR] Rep. of Korea ............. 93-23066

[51] Int. Cl.$^6$ .................................................. H03K 3/17
[52] U.S. Cl. .................... 327/172; 327/34; 327/36; 327/37; 327/38; 365/233.5
[58] Field of Search .................... 327/31, 14, 172–177, 327/34–38, 270, 395, 400, 294; 326/93, 95; 365/233.5

[56] References Cited

U.S. PATENT DOCUMENTS

| 4,742,247 | 5/1988 | Venkatesh | 327/172 |
|---|---|---|---|
| 5,227,679 | 7/1993 | Woo | 327/269 |
| 5,231,320 | 7/1993 | Kase | 327/277 |
| 5,306,958 | 4/1994 | Reddy et al. | 327/14 |
| 5,306,963 | 4/1994 | Leak et al. | 327/14 |
| 5,313,435 | 5/1994 | Kim et al. | 327/14 |
| 5,319,607 | 6/1994 | Fujii et al. | 327/14 |
| 5,426,390 | 6/1995 | Yabe et al. | 327/172 |
| 5,428,580 | 6/1995 | Kawashima et al. | 365/233.5 |
| 5,438,550 | 8/1995 | Kim | 327/175 |
| 5,448,529 | 9/1995 | Reddy et al. | 365/233.5 |
| 5,465,062 | 11/1995 | Fong | 327/172 |
| 5,471,432 | 11/1995 | Makihara | 365/233.5 |

*Primary Examiner*—Timothy P. Callahan
*Assistant Examiner*—Kenneth B. Wells
*Attorney, Agent, or Firm*—Merchant, Gould, Smith, Edell, Welter & Schmidt, P.A.

[57] ABSTRACT

An address transition detecting circuit comprising a first address transition detecting stage for generating a first address transition detection signal, the first address transition detection signal having a pulse width which is constant and stable when a supply voltage is relatively low, a second address transition detecting stage for generating a second address transition detection signal, the second address transition detection signal having the same pulse width as that of the first address transition detection signal from the first address transition detecting stage when the supply voltage is relatively high, a switching stage for switching selectively the first and second address transition detection signals from the first and second address transition detecting stages to an output line, and a supply voltage detecting stage for detecting a level of the supply voltage and controlling the switching stage in accordance with the detected level.

10 Claims, 4 Drawing Sheets

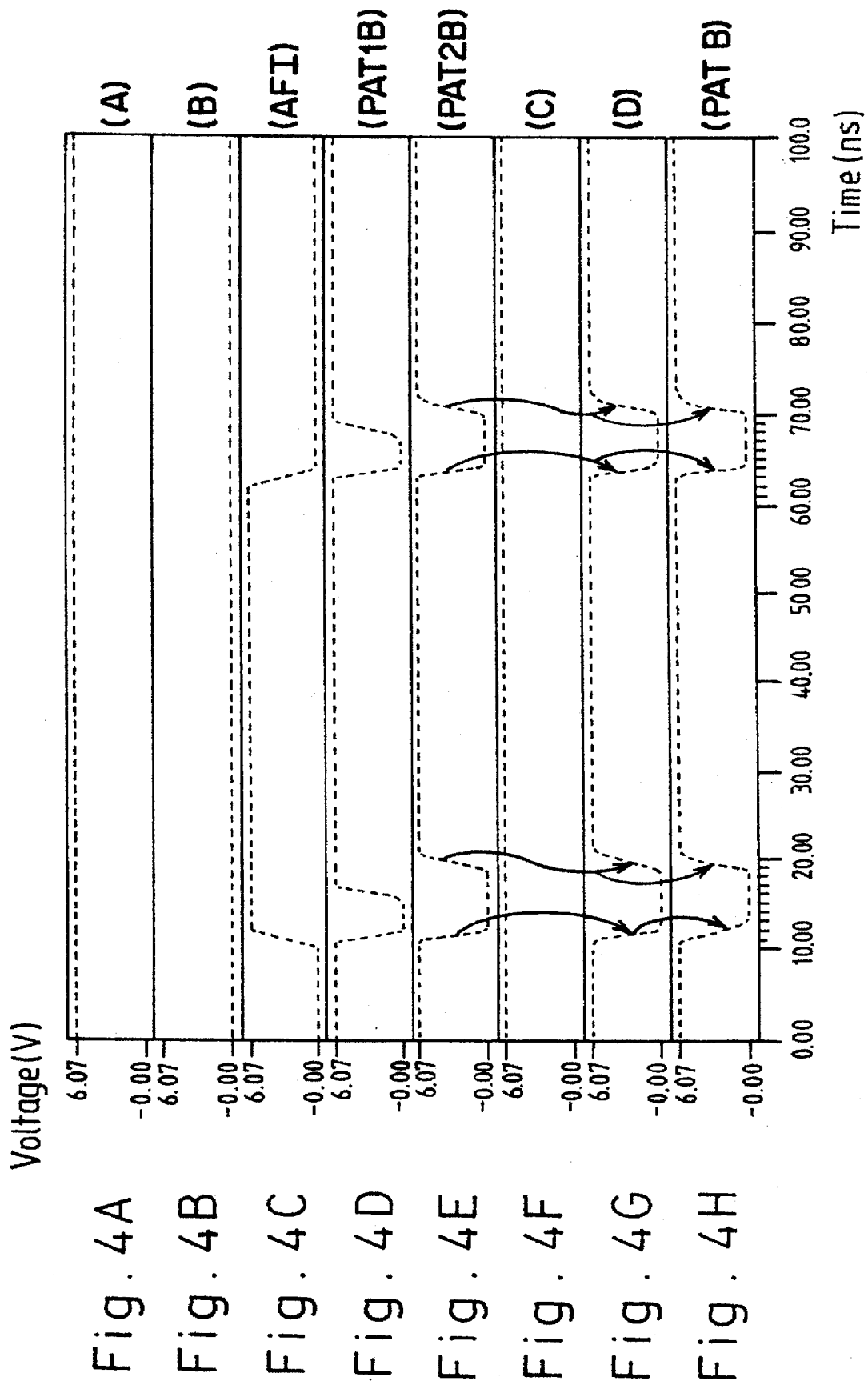

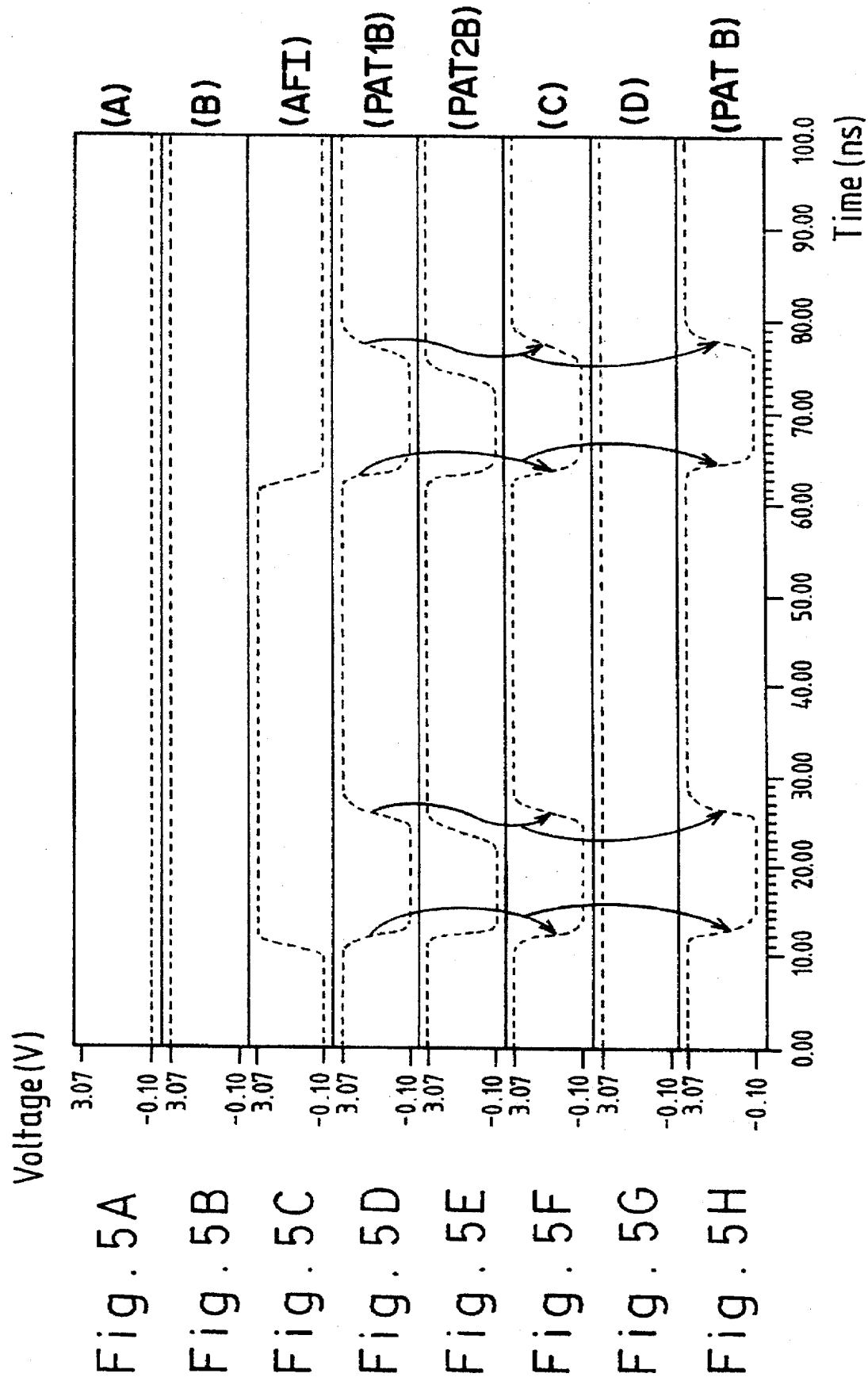

ADDRESS TRANSITION DETECTING CIRCUIT WHICH GENERATES CONSTANT PULSE WIDTH SIGNAL

This is a continuation of application Ser. No. 08/333,479, filed Nov. 2, 1994, now abandoned.

BACKGROUND OF THE INVENTION

1. Field of the invention

The present invention relates in general to semiconductor memory devices, and more particularly to an address transition detecting circuit for generating an address transition detection signal with a pulse width which is constant and stable over a range of low supply voltage to high supply voltage.

2. Description of the Prior Art

The present invention may be applied to semiconductor memory devices such as a dynamic random access memory (DRAM), a static random access memory (SRAM), a mask read only memory (ROM), etc.

Generally, an address transition detecting circuit is adapted to output a pulse signal with a constant pulse width when an external address signal inputted thereto is processed, so as to operate the memory device only while the pulse signal is enabled. As a result, the use of the pulse signal with the constant pulse width has the effect of reducing unnecessary power consumption of the memory device.

The semiconductor memory device has recently been required to be operated over a range of low supply voltage to high supply voltage. In this connection, a conventional address transition detecting circuit with an inverter chain structure has a disadvantage. Namely, a pulse width of an output signal from the conventional address transition detecting circuit with the inverter chain structure, under the condition of a high supply voltage being applied, is reduced as compared with that under the condition of a low supply voltage being applied, because all MOS transistors have high transition speeds when the high supply voltage is applied. The reduced pulse width of the pulse results in a reduction in an operation margin of the memory device. As a result, the memory device cannot be smoothly operated when a high supply voltage is applied.

In order to solve the above problem with the conventional address transition detecting circuit with the inverter chain structure, there has been proposed an address transition detecting circuit with a delay circuit chain structure consisting resistors and capacitors. The conventional address transition detecting circuit with the delay circuit chain structure outputs a pulse signal with a stable pulse width even when a high supply voltage is applied, because the delay circuit chain structure is much less sensitive to a variation of the supply voltage than the MOS transistors. However, under the condition of a low supply voltage being applied, the pulse width of the pulse signal is smaller than a variation width of the peripheral MOS transistors, resulting in a reduction in the operation margin of the memory device. As a result, the memory device cannot be stably operated under the condition of a low supply voltage being applied. The problems with the conventional address transition detecting circuits with the inverter chain structure and the delay circuit chain structure will hereinafter be described in detail with reference to FIGS. 1 and 2.

Referring to FIG. 1, there is shown a circuit diagram of the conventional address transition detecting circuit with the inverter chain structure. As shown in this drawing, the conventional address transition detecting circuit with the inverter chain structure comprises a first delay circuit 11, a first NOR gate and a second NOR gate NR2, each of which inputs an address signal AFI from an input line 10. The first delay circuit 11 delays the address signal AFI from the input line 10 for a predetermined time period and applies the delayed address signal to the first NOR gate NR1. To this end, the first delay circuit 11 includes two inverters I2 and I3 connected in series between the input line 10 and the first NOR gate NR1. The delay time of the first delay circuit 11 is the sum of propagation delay times of the two inverters I2 and I3. The first NOR gate NR1 NORs the address signal AFI from the input line 10 and the delayed address signal from the first delay circuit 11 and applies the NORed result to a second delay circuit 12, which then delays an output signal from the first NOR gate NR1 for the same delay time as that of the first delay circuit 11. To this end, the second delay circuit 12 includes two inverters I4 and I5 connected in series between an output terminal of the first NOR gate NR1 and an input terminal of the second NOR gate NR2. The second NOR gate NR2 NORs the address signal AFI from the input line 10 and an output signal from the second delay circuit 12 and outputs the NORed result as a first transition detection signal. The first transition detection signal has a pulse of high logic with a width corresponding to the sum of the delay times of the first and second delay circuits 11 and 12 beginning with a falling edge of the address signal AFI. The conventional address transition detecting circuit with the inverter chain structure also comprises an inverter I1 for inverting the address signal AFI from the input line 10 and supplying the inverted address signal in common to a third delay circuit 13, a third NOR gate NR3 and a fourth NOR gate NR4. The third delay circuit 13 delays the inverted address signal from the inverter I1 for the same delay time as that of the first delay circuit 11. To this end, the third delay circuit 13 includes two inverters I6 and I7 connected in series between the inverter I1 and the third NOR gate NR3. The third NOR gate NR3 NORs the inverted address signal from the inverter I1 and an output signal from the third delay circuit 13 and applies the NORed result to a fourth delay circuit 14. The fourth delay circuit 14 delays an output signal from the third NOR gate NR3 for the same delay time as that of the first delay circuit 11. To this end, the fourth delay circuit 14 includes two inverters I8 and I9 connected in series between an output terminal of the third NOR gate NR3 and an input terminal of the fourth NOR gate NR4. The fourth NOR gate NR4 NORs the inverted address signal from the inverter I1 and an output signal from the fourth delay circuit 14 and outputs the NORed result as a second transition detection signal. The second transition detection signal has a pulse of high logic with a width corresponding to the sum of the delay times of the third and fourth delay circuits 13 and 14 beginning with a rising edge of the address signal AFI.

Also, the conventional address transition detecting circuit with the inverter chain structure comprises a fifth NOR gate NR5 for inputting the first and second transition detection signals from the second and fourth NOR gates, NR2 and NR4. The fifth NOR gate NR5 NORs the first and second transition detection signals from the second and fourth NOR gates NR2 and NR4 and outputs the NORed result as a main transition detection signal PAT1B through an output line 15. The main transition detection signal PAT1B has pulses of low logic with constant pulse widths at the rising and falling edges of the address signal AFI.

However, each of the inverters I2–I9 of the first to fourth delay circuits 11–14 has a small propagation delay time at a relatively high supply voltage because it is comprised of an NMOS transistor having a high operation speed with the increase of the supply voltage. For this reason, at the relatively high supply voltage, the first to fourth delay circuits 11–14 become very small in delay amount, thereby causing the width of the low logic pulse of the main transition detection signal PAT1B to become very small. The small pulse width of the main transition detection signal PAT1B results in a reduction in the operation margin of the memory device. As a result, the memory device may have faulty operation.

Referring to FIG. 2, there is shown a circuit diagram of the conventional address transition detecting circuit with the delay circuit chain structure. As shown in this drawing, the conventional address transition detecting circuit with the delay circuit chain structure comprises a first delay stage 21, a first NOR gate NR6 and a second NOR gate NR7, each of which inputs an address signal AFI from an input line 20. The first delay stage 21 delays the address signal AFI from the input line 20 for a predetermined time period and applies the delayed address signal to the first NOR gate NR6. To this end, the first delay stage 21 includes three delay circuits connected in series between the input line 20 and the first NOR gate NR6. Each of the three delay circuits of the first delay stage 21 includes a resistor R1, R2 or R3 and a capacitor C1, C2 or C3. Each of the three delay circuits has a delay corresponding to a time constant which is obtained by multiplying a resistance of a corresponding one of the resistors R1–R3 by a capacitance of a corresponding one of the capacitors C1–C3. The resistance of each of the resistors R1–R3 and the capacitance of each of the capacitors C1–C3 are set properly so that the time constant can be constant at a relatively high supply voltage (for example, about DC 6 V). The delay time of the first delay stage 21 is the sum of delay times of the three delay circuits R1–R3 and C1–C3. The first NOR gate NR6 NORs the address signal AFI from the input line 20 and the delayed address signal from the first delay stage 21 and applies the NORed result to a second delay stage 22. The second delay stage 22 delays an output signal from the first NOR gate NR6 for the same delay time as that of the first delay stage 21. To this end, the second delay stage 22 includes three delay circuits connected in series between an output terminal of the first NOR gate NR6 and an input terminal of the second NOR gate NR7. Each of the three delay circuits of the second delay stage 22 includes a resistor R4, R5 or R6 and a capacitor C4, C5 or C6. The second NOR gate NR7 NORs the address signal AFI from the input line 20 and an output signal from the second delay stage 22 and outputs the NORed result as a first transition detection signal. The first transition detection signal has a pulse of high logic with a width corresponding to the sum of the delay times of the first and second delay stages 21 and 22 beginning with a falling edge of the address signal AFI.

Also, the conventional address transition detecting circuit with the delay circuit chain structure comprises an inverter I10 for inverting the address signal AFI from the input line 20 and supplying the inverted address signal in common to a third delay stage 23, a third NOR gate NR8 and a fourth NOR gate NR9. The third delay stage 23 delays the inverted address signal from the inverter I10 for the same delay time as that of the first delay stage 21. To this end, the third delay stage 23 includes three delay circuits connected in series between the inverter I10 and the third NOR gate NR8. Each of the three delay circuits of the third delay stage 23 includes a resistor R7, R8 or R9 and a capacitor C8 or C9. The third NOR gate NR8 NORs the inverted address signal from the inverter I10 and an output signal from the third delay stage 23 and applies the NORed result to a fourth delay stage The fourth delay stage 24 delays an output signal from the third NOR gate NR8 for the same delay time as that of the first delay stage 21. To this end, the fourth delay stage 24 includes three delay circuits connected in series between an output terminal of the third NOR gate NR8 and an input terminal of the fourth NOR gate NR9. Each of the three delay circuits of the fourth delay stage includes a resistor R10, R11 or R12 and a capacitor C10, C11 or C12. The fourth NOR gate NR9 NORs the inverted address signal from the inverter I10 and an output signal from the fourth delay stage 24 and outputs the NORed result as a second transition detection signal. The second transition detection signal has a pulse of high logic with a width corresponding to the sum of the delay times of the third and fourth delay stages 23 and 24 beginning with a rising edge of the address signal AFI.

The conventional address transition detecting circuit with the delay circuit chain structure also comprises a fifth NOR gate NR10 for inputting the first and second transition detection signals from the second and fourth NOR gates NR7 and NR9. The fifth NOR gate NR10 NORs the first and second transition detection signals from the second and fourth NOR gates NR7 and NR9 and outputs the NORed result as a main transition detection signal PAT2B through an output line 25. The main transition detection signal PAT2B has pulses of low logic with constant pulse widths at the rising and falling edges of the address signal AFI.

However, each of the delay circuits of the first to fourth delay stages 21–24 has a small propagation delay time at a relatively low supply voltage because it is comprised of the resistor and the capacitor having a time constant which is constant at the relatively high supply voltage. For this reason, at the relatively low supply voltage, the first to fourth delay stages 21–24 become very small in delay amount, thereby causing the width of the low logic pulse of the main transition detection signal PAT2B to become very small. The small pulse width of the main transition detection signal PAT2B results in a reduction in the operation margin of the memory device, As a result, the memory device may have faulty operation.

SUMMARY OF THE INVENTION

Therefore, the present invention has been made in view of the above problems, and it is an object of the present invention to provide an address transition detecting circuit for generating an address transition detection signal with a pulse width which is constant and stable over a range of low supply voltage to high supply voltage.

In accordance with the present invention, the above and other objects can be accomplished by the provision of an address transition detecting circuit comprising first address transition detecting means for generating a first address transition detection signal, said first address transition detection signal having a pulse width which is constant and stable when a supply voltage is relatively low; second address transition detecting means for generating a second address transition detection signal, said second address transition detection signal having the same pulse width as that of said first address transition detection signal from said first address transition detecting means when the supply voltage is relatively high; switching means for selectively switching said first and second address transition detection signals from said first and second address transition detecting means to an output line; and supply voltage detecting means for detecting a level of the supply voltage and controlling said switching means in accordance with the detected level.

BRIEF DESCRIPTION OF THE DRAWINGS

The above and other objects, features and advantages of the present invention will be more clearly understood from the following detailed description taken in conjunction with the accompanying drawings, in which:

FIGS. 4A to 4H are waveform diagrams of output signals from components in FIG. 1 under the condition of a supply voltage being relatively high; and FIGS. 5A to 5H are waveform diagrams of the output signals from the components in FIG. 1 under the condition of the supply voltage being relatively low.

DETAILED DESCRIPTION OF THE PREFERRED EMBODIMENT

Figure 1:
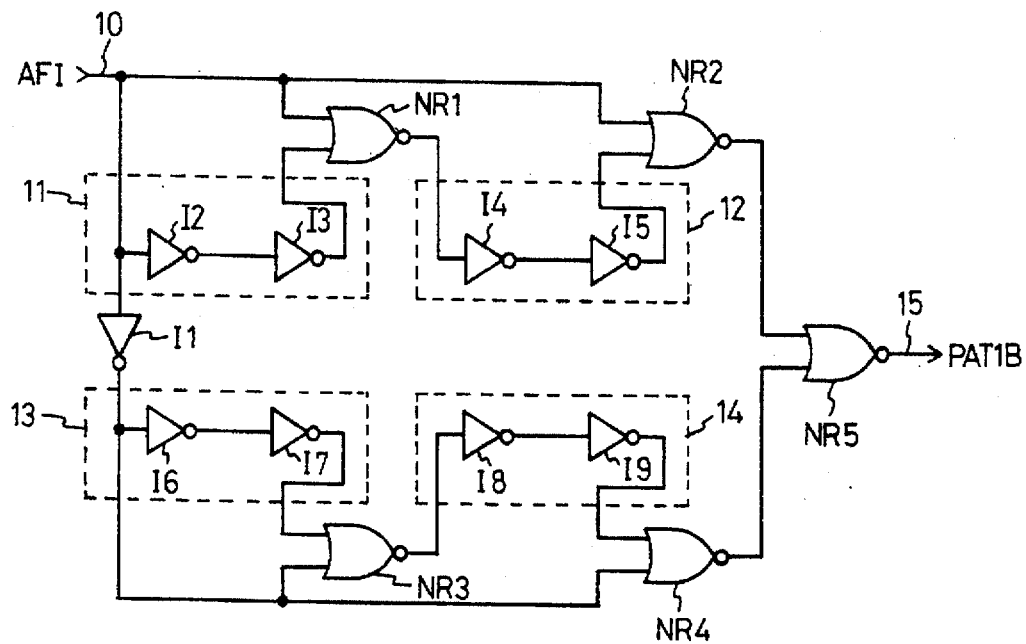
FIG. 1 is a circuit diagram of a conventional address transition detecting circuit with an inverter chain structure.
Figure 3:
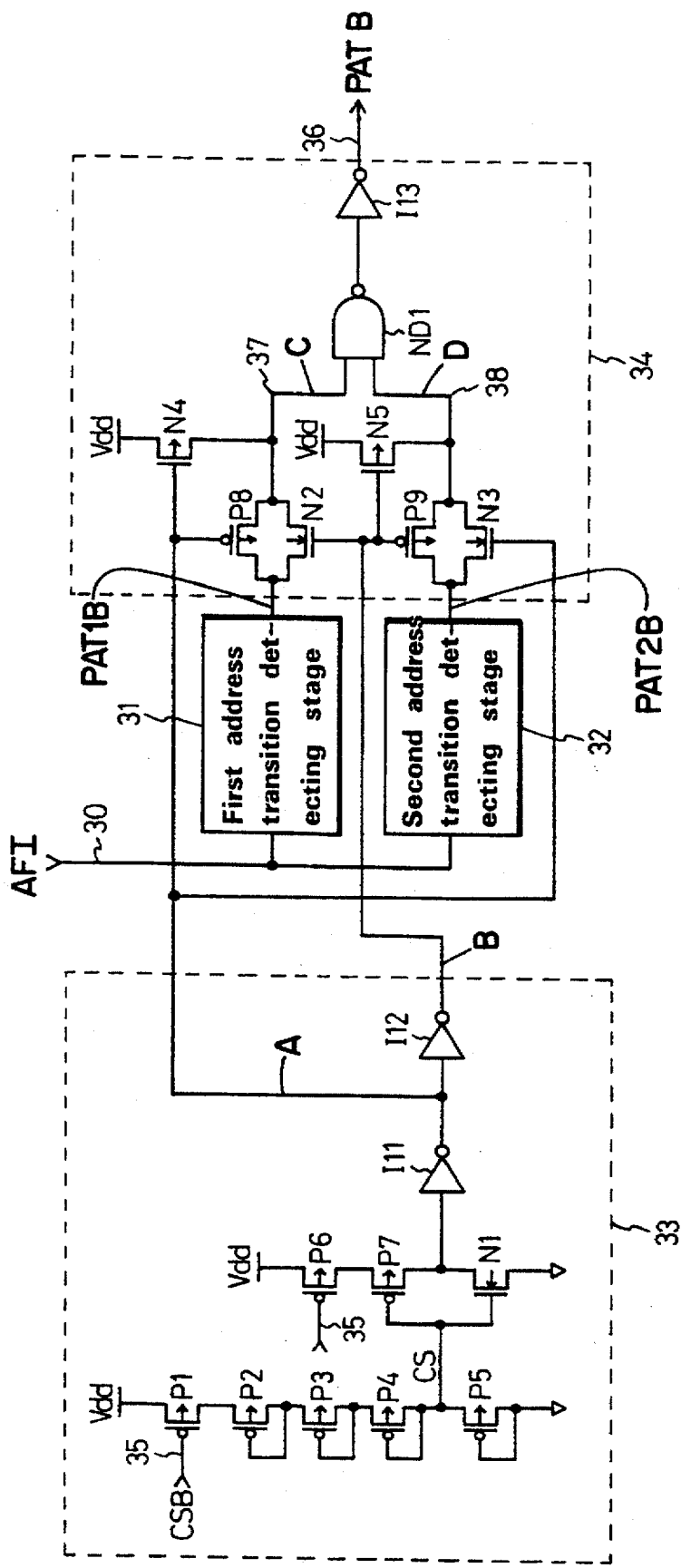
FIG. 3 is a circuit diagram of an address transition detecting circuit in accordance with the present invention.

FIG. 3 is a circuit diagram of an address transition detecting circuit in accordance with the present invention, FIGS. 4A to 4H are waveform diagrams of output signals from components in FIG. 1 under the condition of a supply voltage being relatively high and FIGS. 5A to 5H are waveform diagrams of the output signals from the components in FIG. 1 under the condition that the supply voltage is relatively low.

Referring to FIG. 3, the address transition detecting circuit of the present invention comprises first and second address transition detecting stages 31 and 32, each of which inputs an address signal AFI from a first input line 30. The first address transition detecting stage 31 generates a first address transition detection signal PAT1B with pulses of low logic at rising and falling edges of the address signal AFI. The first address transition detecting stage 31 has the same construction as that of the address transition detecting circuit in FIG. 1. Since the first address transition detecting stage 31 includes the delay circuits of the inverter chain structure, the first address transition detection signal PAT1B has a pulse width which is constant and stable when a supply voltage Vdd–Vss is relatively low. When the supply voltage Vdd–Vss is relatively high, or 6.07 V, the first address transition detection signal PAT1B has a very small pulse width of 5 ns as shown in FIG. 4D. Conversely, when the supply voltage Vdd–Vss is relatively low, or 3.17 V, the first address transition detection signal PAT1B has a relatively large pulse width of 14 ns as shown in FIG. 5D.

Figure 2:
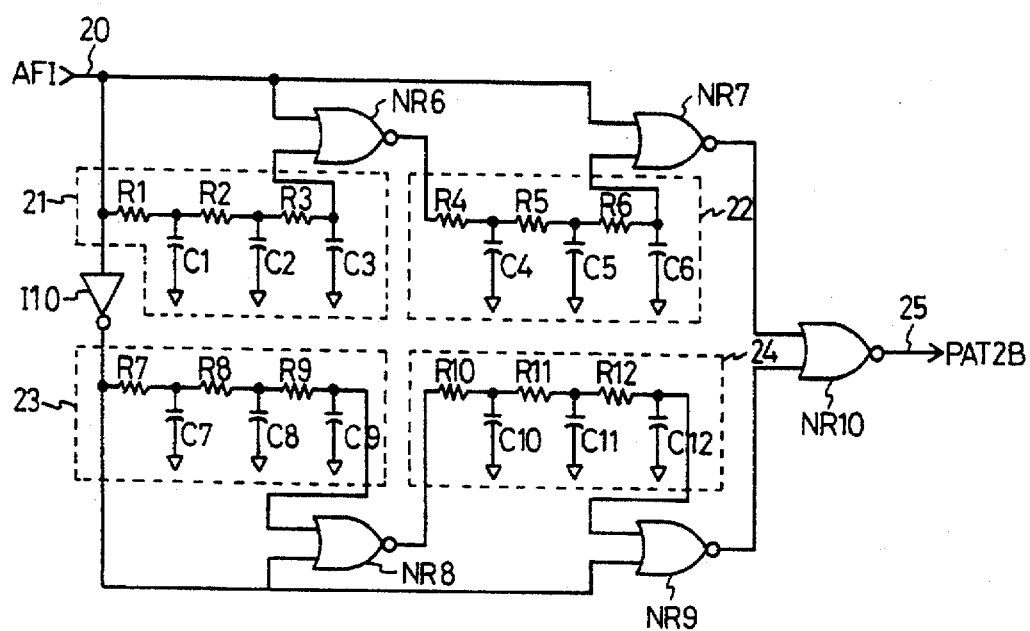
FIG. 2 is a circuit diagram of a conventional address transition detecting circuit with a delay circuit chain structure consisting of resistors and capacitors.

The second address transition detecting stage 32 generates a second address transition detection signal PAT2B with pulses of low logic at the rising and falling edges of the address signal AFI. The second address transition detecting stage 32 has the same construction as that of the address transition detecting circuit in FIG. 2. Because the second address transition detecting stage 32 includes the delay circuit chain structure consisting of the resistors and capacitors, the second address transition detection signal PAT2B has a pulse width which is constant and stable even when the supply voltage Vdd–Vss is relatively high. When the supply voltage Vdd–Vss is relatively high, or 6.07 V, the second address transition detection signal PAT2B has a considerably large pulse width of 9 ns as shown in FIG. 4E. Conversely, when the supply voltage Vdd–Vss is relatively low, or 3.17 V, the second address transition detection signal PAT2B has a relatively large pulse width of 12 ns as shown in FIG. 5E.

As a result, in the case where the supply voltage Vdd–Vss is relatively high, the first address transition detecting stage Generates the first address transition detection signal PAT1B having the pulse width which is much smaller than that of the second address transition detection signal PAT2B from the second address transition detecting stage 32. Conversely, in the case where the supply voltage Vdd–Vss is relatively low, the first address transition detecting stage 31 generates the first address transition detection signal PAT1B having the pulse width which is larger than that of the second address transition detection signal PAT2B from the second address transition detecting stage The address transition detecting circuit of the present invention also comprises a supply voltage detecting stage 33 for detecting a level of the supply voltage Vdd–Vss and outputting first and second control signals in accordance with the detected level. To this end, the supply voltage detecting stage 33 includes first to fifth PMOS transistors P1–P8 connected in series between first and second supply voltage sources Vdd and Vss. The first PMOS transistor P1 has a gate for inputting a chip enable signal CSB from a second input line 35. The first PMOS transistor P1 transfers a first supply voltage Vdd from the first supply voltage source Vdd to the second PMOS transistor P2 according to a logic state of the chip enable signal CSB from the second input line 35. Each of the second to fifth PMOS transistors P2–P5 has a gate connected to its drain, to function as a resistor. Also, the second to fifth PMOS transistors P2–P5 act with the first PMOS transistor P1 to divide the supply voltage Vdd–Vss. The fourth PMOS transistor P4 transfers a voltage obtained by dividing the supply voltage Vdd–Vss through its drain in common to a gate of a seventh PMOS transistor P7 and a gate of a first NMOS transistor N1. The voltage generated at the drain of the fourth PMOS transistor P4 has a level of 0.7 V or more when the supply voltage Vdd–Vss is relatively high, or 6.07 V. Conversely, when the supply voltage Vdd–Vss is relatively low, or 3.17 V to 6.07 V, the voltage divided by the first to fifth PMOS transistors P1–P5 has a level of 0.7 V or less. Each of the first to fifth PMOS transistors P1–P5 may have such a proper channel width that the voltage generated at the drain of the fourth PMOS transistor P4 can have the level of 0.7 V or more when the supply voltage Vdd–Vss is relatively high, or 6.07 V, Also, an additional PMOS transistor may be connected to the first to fifth PMOS transistors P1–P5 so that the voltage generated at the drain of the fourth PMOS transistor P4 can have the level of 0.7 V or more when the supply voltage Vdd–Vss is relatively high, or 6.07 V.

Also, the supply voltage detecting stage 33 includes a sixth PMOS transistor P6 having a gate for inputting the chip enable signal CSB from the second input line 35. The sixth PMOS transistor P6 transfers the first supply voltage Vdd from the first supply voltage source Vdd to a source of the seventh PMOS transistor P7 when the chip enable signal CSB from the second input line 35 is logically low. The seventh PMOS transistor P7 and the first NMOS transistor N1 constitute an inverter. As a result, the sixth PMOS transistor P6 acts in response to the logic state of the chip enable signal CSB to switch an operating voltage to the seventh PMOS transistor P7 and the first NMOS transistor N1 constituting the inverter.

Both the seventh PMOS transistor P7 and the first NMOS transistor N1 constituting the inverter generate a comparison signal of high or low logic according to the level of the divided voltage from the drain of the fourth PMOS transistor P4. When the divided voltage is lower than 0.7 V, the seventh PMOS transistor P7 transfers the first supply voltage Vdd from the sixth PMOS transistor P6 to a first inverter I11 as the comparison signal of high logic. Conversely, when the divided voltage is higher than 0.7 V, the first NMOS transistor N1 transfers a second supply voltage Vss from the second supply voltage source Vss to the first inverter I11 as the comparison signal of low logic. The comparison signal has the high logic when the supply voltage Vdd–Vss is lower than 6.07 V and the low logic when the supply voltage Vdd–Vss is higher than 6.07 V.

The first inverter I11 inverts the comparison signal from the seventh PMOS transistor P7 or the first NMOS transistor N1 and outputs the inverted comparison signal A as the first control signal to a second inverter I12. The second inverter I12 inverts the first control signal from the first inverter I11 and outputs the inverted first control signal B as the second control signal. The first control signal has a high level as shown in FIG. 4A when the supply voltage Vdd–Vss is higher than 6.07 V and a low level as shown in FIG. 5A when the supply voltage Vdd–Vss is lower than 6.07 V. The second control signal has a low level as shown in FIG. 4B when the supply voltage Vdd–Vss is higher than 6.07 V and a high level as shown in FIG. 5B when the supply voltage Vdd–Vss is lower than 6.07 V.

Further, the address transition detecting circuit of the present invention comprises a switching stage 34 for switching selectively the first and second address transition detection signals PAT1B and PAT2B from the first and second address transition detecting stages 31 and 32 to an output line 36 in response to the first and second control signals from the supply voltage detecting stage 33. When the supply voltage Vdd–Vss is higher than 6.07 V, the switching stage 34 outputs the second address transition detection signal PAT2B from the second address transition detecting stage 32 to the output line 36. Conversely, when the supply voltage Vdd–Vss is lower than 6.07 V, the switching stage 34 outputs the first address transition detection signal PAT1B from the first address transition detecting stage 31 to the output line 36. To this end, the switching stage 34 includes an eighth PMOS transistor P8 having a gate for inputting the first control signal from the supply voltage detecting stage 33, a ninth PMOS transistor P9 having a gate for inputting the second control signal from the supply voltage detecting stage 33, and a second NMOS transistor N2 having a gate for inputting the second control signal from the supply voltage detecting stage 33. The switching stage 34 also includes third and fourth NMOS transistor N3 and N4, each of which has a gate for inputting the first control signal from the supply voltage detecting stage and a fifth NMOS transistor N5 having a gate for inputting the second control signal from the supply voltage detecting stage 33.

When the eighth PMOS transistor P8 inputs the first control signal of low logic as shown in FIG. 5A at its gate, it transfers the first address transition detection signal PAT1B from the first address transition detecting stage 31 to a first input terminal 37(c) of a NAND gate ND1. When the second NMOS transistor N2 inputs the second control signal of high logic as shown in FIG. 5B at its gate, it transfers the first address transition detection signal PAT1B from the first address transition detecting stage 31 to the first input terminal 37 of the NAND gate ND1. As a result, when the supply voltage Vdd–Vss is lower than 6.07 V, the eighth PMOS transistor P8 and the second NMOS transistor N2 transfer the first address transition detection signal PAT1B from the first address transition detecting stage 31 to the first input terminal 37 of the NAND gate ND1.

When the ninth PMOS transistor P9 inputs the second control signal of low logic as shown in FIG. 4B at its gate, it transfers the second address transition detection signal PAT2B from the second address transition detecting stage 32 to a second input terminal 38 of the NAND gate ND1. When the third NMOS transistor N3 inputs the first control signal of high logic as shown in FIG. 4A at its gate, it transfers the second address transition detection signal PAT2B from the second address transition detecting stage 32 to the second input terminal 38(D) of the NAND gate ND1. As a result, when the supply voltage Vdd–Vss is higher than 6.07 V, the ninth PMOS transistor P9 and the third NMOS transistor N3 transfer the second address transition detection signal PAT2B from the second address transition detecting stage 32 to the second input terminal 38 of the NAND gate ND1.

On the other hand, when the fourth NMOS transistor N4 inputs the first control signal of high logic as shown in FIG. 4A at its gate, namely, when the supply voltage Vdd–Vss is higher than 6.07 V, it transfers the first supply voltage Vdd from the first supply voltage source Vdd to the first input terminal 37 of the NAND gate. ND1. As a result, a logic signal of high level is applied to the first input terminal 37 of the NAND gate ND1. When the fifth NMOS transistor N5 inputs the second control signal of high logic as shown in FIG. 5B at its gate, namely, when the supply voltage Vdd–Vss is lower than 6.07 V, it transfers the first supply voltage Vdd from the first supply voltage source Vdd to the second input terminal 38 of the NAND gate ND1. As a result, a logic signal of high level is applied to the second input terminal 38 of the NAND gate ND1. In result, the first input terminal 37 of the NAND gate ND1 inputs the logic signal of high level as shown in FIG. 4F when the supply voltage Vdd–Vss is higher than 6.07 V, whereas the first address transition detection signal PAT1B as shown in FIG. 5F when the supply voltage Vdd–Vss is lower than 6.07 V. Also, the second input terminal 38 of the NAND gate ND1 inputs the logic signal of high level as shown in FIG. 5G when the supply voltage Vdd–Vss is lower than 6.07 V, whereas the second address transition detection signal PAT2B as shown in FIG. 4G when the supply voltage Vdd–Vss is higher than 6.07 V.

The NAND gate ND1 NANDs the signals inputted at its first and second input terminals 37 and 38 and applies the NANDed signal to a third inverter I13. An output signal from the NAND gate ND1 is an inverted one of the second address transition detection signal PAT2B when the supply voltage Vdd–Vss is higher than 6.07 V, whereas an inverted one of the first address transition detection signal PAT1B when the supply voltage Vdd–Vss is lower than 6.07 V. The third inverter I13 inverts the output signal from the NAND gate ND1 and outputs the inverted signal as a third address transition detection signal PATB. When the supply voltage Vdd–Vss is higher than 6.07 V, the third address transition detection signal PATB has a low logic pulse with a width of 9 ns as shown in FIG. 4H. Conversely, when the supply voltage Vdd–Vss is lower than 6.07 V, the third address transition detection signal PATB, has a low logic pulse with a width of 14 ns as shown in FIG. 5H.

As apparent from the above description, the address transition detecting circuit of the present invention comprises the first address transition detecting stage for generating the address transition detection signal with the pulse width which is stable at the relatively low supply voltage, and the second address transition detecting stage for generating the address transition detection signal with the pulse width which is stable at the relatively high supply voltage. The address transition detection signals from the first and second address transition detecting stages are switched according to the level of the supply voltage, so that the final address transition detection signal can have a pulse width which is constant and stable regardless of the variation of the supply voltage. Therefore, the operation margin of the memory device can be stably maintained. This has the effect of preventing a faulty operation of the memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An address transition detecting circuit supplied with a supply voltage varying over a range from relatively low to relatively high, said address transition detecting circuit having an input line and an output line, comprising:

first address transition detecting means for generating a first address transition detection signal, said first address transition detection signal having a pulse width which is constant and stable when the supply voltage is relatively low;

second address transition detecting means for generating a second address transition detection signal, said second address transition detection signal having the same pulse width as that of said first address transition detection signal from said first address transition detecting means, when the supply voltage is relatively high;

supply voltage detecting means for detecting a level of the supply voltage and outputting first and second control signals in accordance with the detected level; and switching means for switching selectively said first and second address transition detection signals from said first and second address transition means to the output line in response to said first and second control signals from said supply voltage detecting means.

2. An address transition detecting circuit as set forth in claim 1, wherein said supply voltage detecting means includes:

voltage dividing means for dividing the supply voltage at a desired ratio; and comparing means for comparing an output voltage from said voltage dividing means with a predetermined voltage and outputting said first and second control signals in accordance with the compared result.

3. An address transition detecting circuit as set forth in claim 2, wherein the supply voltage is supplied by first and second supply voltage sources, and wherein said voltage dividing means includes at least two MOS transistors connected in series between the first and second supply voltage sources.

4. An address transition detecting circuit as set forth in claim 2, wherein a chip enable signal is provided to said address transition detecting circuit via a control line, and wherein said supply voltage detecting means further includes a first control switching device for connecting selectively said voltage-dividing means to said supply voltage in response to the chip enable signal from the control line.

5. An address transition detecting circuit as set forth in claim 4, wherein said supply voltage detecting means further includes a second control switching device for switching an operating voltage to said comparing means in response to the chip enable signal from the control line.

6. An address transition detecting circuit as set forth in claim 2, wherein said comparing means includes an inverter, said inverter having a threshold voltage.

7. An address transition detecting circuit as set forth in claim 2, wherein said switching means includes:

a third control switching device connected between said first address transition detecting means and said output line, said third control switching device switching said first address transition detection signal from said first address transition detecting means to said output line in response to the first control signal from said comparing means; and a fourth control switching device connected between said second address transition detecting means and said output line, said fourth control switching device being operated in complementary cooperation with said third control switching device to switch said second address transition detection signal from said second address transition detecting means to said output line in response to the second control signal from said comparing means.

8. An address transition detecting circuit as set forth in claim 7, wherein said switching means further includes:

a fifth control switching device being operated in complementary cooperation with said third control switching device to switch a specified level of logic signal from a logic signal source to an output terminal of said third control switching device;

a sixth control switching device being operated in complementary cooperation with said fourth control switching device to switch said logic signal from said logic signal source to an output terminal of said fourth control switching device; and a logic operation device for performing a logic operation with output signals from said third and fifth control switching devices and output signals from said fourth and sixth control switching devices and outputting the resultant signal as an address transition detection signal to said output line.

9. A method of detecting an address transition using a circuit arrangement having a supply voltage which varies from a relatively low voltage to a relatively high voltage to produce output address transition detection signals having a substantial constant pulse width, the method comprising:

generating first address transition detection signals having a predetermined pulse width which is constant and stable when the supply voltage is relatively high using a first address transition detection circuit;

generating second address transition detection signals having the predetermined pulse width which is constant and stable when the supply voltage is relatively low using a second address transition detection circuit;

determining a voltage level of the supply voltage; and selectively outputting a first address transition detection signal as the output address transition detection signal if the determined voltage level of the supply voltage is relatively high and outputting a second address transition detection signal as the output address transition detection signal if the determined voltage level of the supply voltage is relatively low.

10. A method as recited in claim 9, wherein:

the first address transition detection circuit includes a delay chain; and the second address transition detection circuit includes an inverter chain.

* * * * *